US005733426A

United States Patent [19]
Cox et al.

[11] Patent Number: 5,733,426
[45] Date of Patent: Mar. 31, 1998

[54] SEMICONDUCTOR WAFER CLAMP DEVICE AND METHOD

[75] Inventors: Arthur L. Cox, Buda; David G. Bell, Cedar Park; Mark S. Reinbold, Cedar Creek, all of Tex.

[73] Assignee: Advanced Micro Devices, Inc., Sunnyvale, Calif.

[21] Appl. No.: 447,904

[22] Filed: May 23, 1995

[51] Int. Cl.⁶ ............................ C23C 14/50; B05C 13/02
[52] U.S. Cl. .................... 204/298.01; 118/728; 118/500; 118/503; 156/345; 269/97; 269/254 R; 269/254 CS; 269/289 R; 269/317; 269/903
[58] Field of Search ................. 204/298.15; 118/728, 118/723 E, 500, 503; 156/345; 269/97, 254 R, 254 CS, 289 R, 317, 903

[56] References Cited

U.S. PATENT DOCUMENTS 4,522,697  6/1985  Dimock et al. ............... 204/298.15
5,478,399  12/1995  Willard ........................ 118/728

OTHER PUBLICATIONS

Figures 1,2,3 and description on pp. 3–6 of patent application.
Figure 1 and accompanying description on pp. 3–4 of patent application.
Figure 2 and accompanying description on p. 4 of patent application.
Figure 3 and accompanying description on pp. 4–6 of patent application.

*Primary Examiner*—R. Bruce Breneman
*Assistant Examiner*—Rodney G. McDonald
*Attorney, Agent, or Firm*—Conley, Rose & Tayon, P.C.

[57] ABSTRACT

Semiconductor wafer clamp device includes at least one clamp apparatus, the clamp apparatus including a removable clamp finger coupled to a connecting block by a connector. The device allows access to clamp apparatus from a top surface of a substrate holder, eliminating the need to remove the substrate holder in order to perform maintenance or repair operations on clamp apparatus. Tempered springs in the clamp apparatus reduce resilience losses experienced with non-tempered springs. Plastic clamp shaft bushings and spring retainers extend the useful life of clamp apparatus components by eliminating wear caused by metal-to-metal contact of moving parts.

22 Claims, 7 Drawing Sheets

SEMICONDUCTOR WAFER CLAMP DEVICE AND METHOD

BACKGROUND OF THE INVENTION

1. Field of the Invention

This invention relates to an improved wafer clamp device used for retaining a semiconductor wafer.

2. Description of the Related Art

The manufacture of integrated circuits includes numerous processes. One of these processes is the deposition of metal film upon a semiconductor wafer. After some of this metal film is subsequently selectively removed, the remaining sections of metal film act as conductors which electrically connect circuit elements. These remaining sections of metal film are called interconnects. One or more layers of metal may be deposited upon a semiconductor wafer depending upon interconnect complexity.

Several techniques may be used to deposit metal upon a semiconductor wafer. A typical technique involves sputter deposition. Sputter deposition entails evacuating a chamber containing: a semiconductor wafer, a source of positively charged ions, and a target comprising a block of the metal to be deposited on the semiconductor wafer. The target metal is maintained at a negative electrical potential relative to the ion charge. The positively charged ions produced by the source are directed at the more negatively charged target metal. The ions have sufficient energy to dislodge atoms from the target metal, and the dislodged (sputtered) atoms settle on everything in the evacuated chamber, including the semiconductor wafer. The atoms of the target metal settling on the semiconductor wafer then condense to form a thin film. Common methods used to deposit metallic thin films on semiconductor wafers include diode, triode, and magnetron sputtering.

A sputter deposition apparatus generally includes a sputter chamber, biasing electrodes within the chamber, a sputter target or targets, vacuum pumps, power supplies, gas supply and flow controllers, wafer heaters, and wafer holders/handling mechanisms. To achieve a controllable deposition rate across the entire wafer surface, each of the components must be carefully controlled. One way to ensure proper control is to secure the wafer at a known location within the sputter chamber such that the wafer can optimally receive sputtered particles. Wafer clamp devices are used for this purpose.

A second function of a wafer clamp device is to retain the wafer near or against an external heat source. Metal deposition upon a heated wafer improves desired interconnect properties. The wafer is typically heated in the range of 220° to 270° C., for example, to desorb moisture from the deposited material. The resulting metal film shows improved adhesion with minimum film cracking. Wafers heated to 250° C. and above show improved step coverage. Atoms of a metal arriving onto a surface of a semiconductor wafer heated to 250° C. or above remain mobile for an instant before cooling, and tend to fill in abrupt changes in the topography, called steps, which would otherwise receive few sputtered particles.

Heating of the wafer is often a natural consequence of the sputter deposition process. Heating occurs primarily from high-energy electrons striking the exposed surface of the wafer, heat-of-condensation of the depositing film, and the kinetic energy of the arriving film atoms. Sputter heating alone, however, is not sufficient to enhance film properties and step coverage. An auxiliary heating mechanism is often needed to produce wafer temperatures above 200° C. One common auxiliary heating mechanism is to subject the backside of a semiconductor wafer to the emissions of a heat lamp during the sputtering operation.

Thus two main functions of a semiconductor wafer clamp device are to secure a semiconductor wafer at a known location within a sputter chamber such that the wafer can optimally receive sputtered particles, and to retain the wafer near or against an external heat source during the sputtering operation in order to improve step coverage. In addition, a wafer clamp device must also require a minimal amount of time for routine maintenance and repair in order to maximize the throughput of the wafer sputter system.

Figure 1:
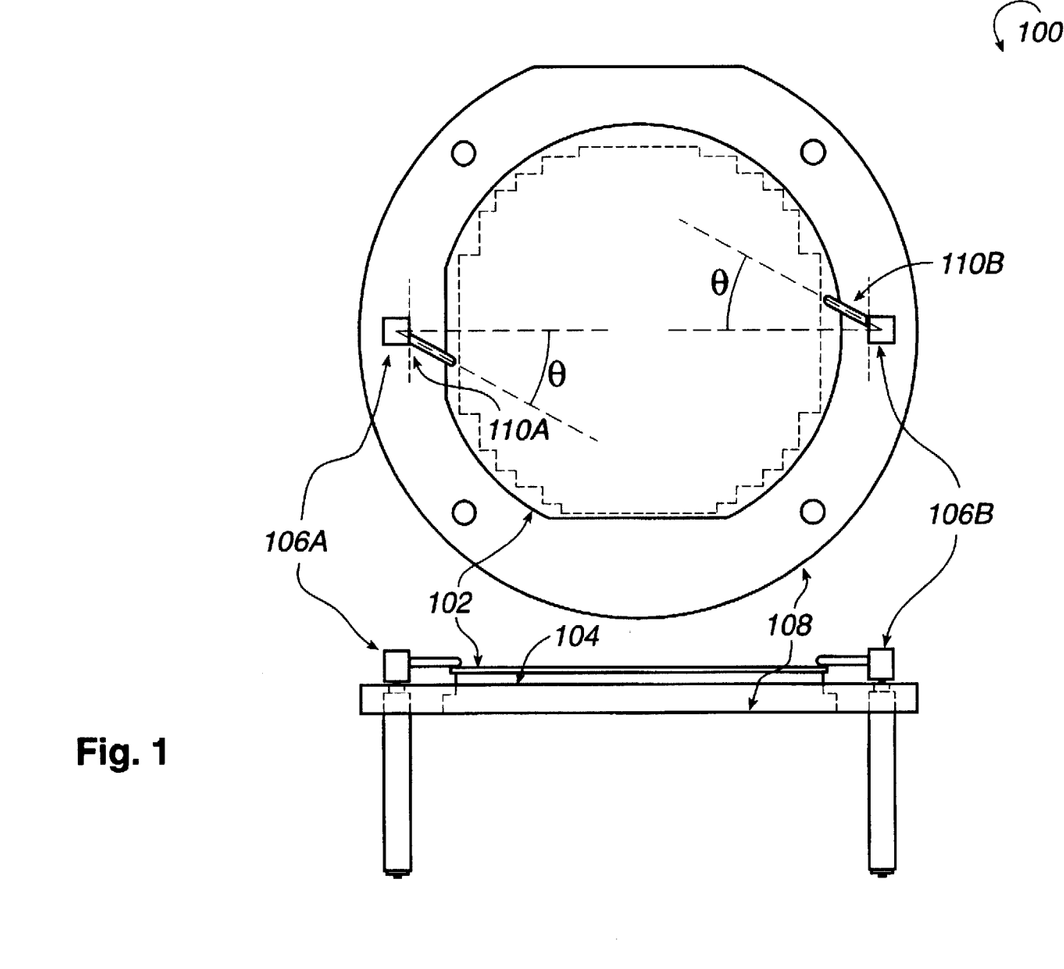
FIG. 1 is a diagram of a semiconductor wafer clamp device holding a semiconductor wafer against a substrate.

FIG. 1 depicts a semiconductor wafer clamp device 100 holding a semiconductor wafer 102 against a substrate 104. Semiconductor wafer clamp device 100 includes two clamp apparatus, 106A and 106B, mounted in a substrate holder 108. Substrate 104 is also mounted in substrate holder 108. This semiconductor wafer clamp device may be used in an ANELVA model 1015 sputtering system (ANELVA Co., Tokyo, Japan). During use, substrate holder 108 is mounted to a flat surface in a sputter chamber with semiconductor wafer 102 subject to sputtered particles. Semiconductor wafer 102 is mounted under the spring-loaded fingers of clamp apparatus 106A and 106B, causing the semiconductor wafer 102 to be pressed against substrate 104. Substrate 104 and semiconductor wafer 102 may be heated by emissions of a heat lamp mounted under substrate 104.

Projecting members 110A-B of clamp apparatus 106A-B may extend outwardly at angles Θ greater than 0 degrees as shown in FIG. 1. The use of projecting members 110A-B with different angles Θ during separate sputtering operations of a multi-layer metalization process may be employed to prevent shadowing of the areas of semiconductor wafer 102 directly under projecting members 110A-B, thus ensuring the entire surface of semiconductor wafer 102 receives sputtered particles.

Figure 2:
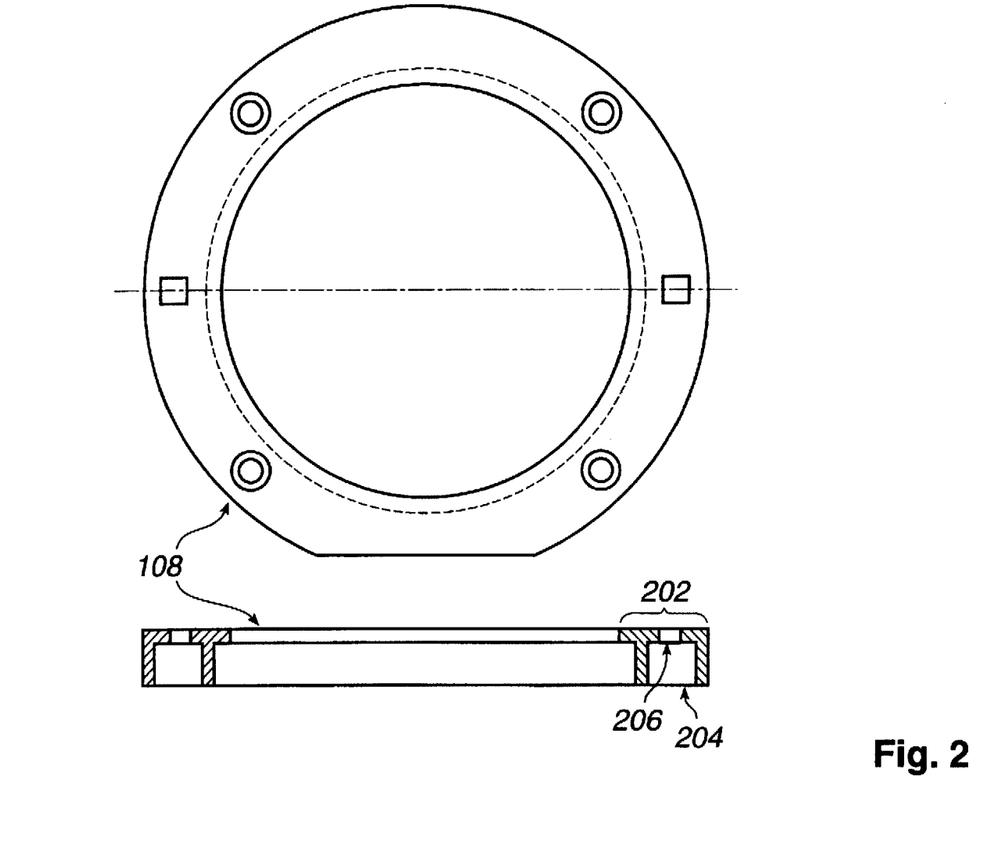
FIG. 2 is a diagram of a substrate holder.
Figure 3:
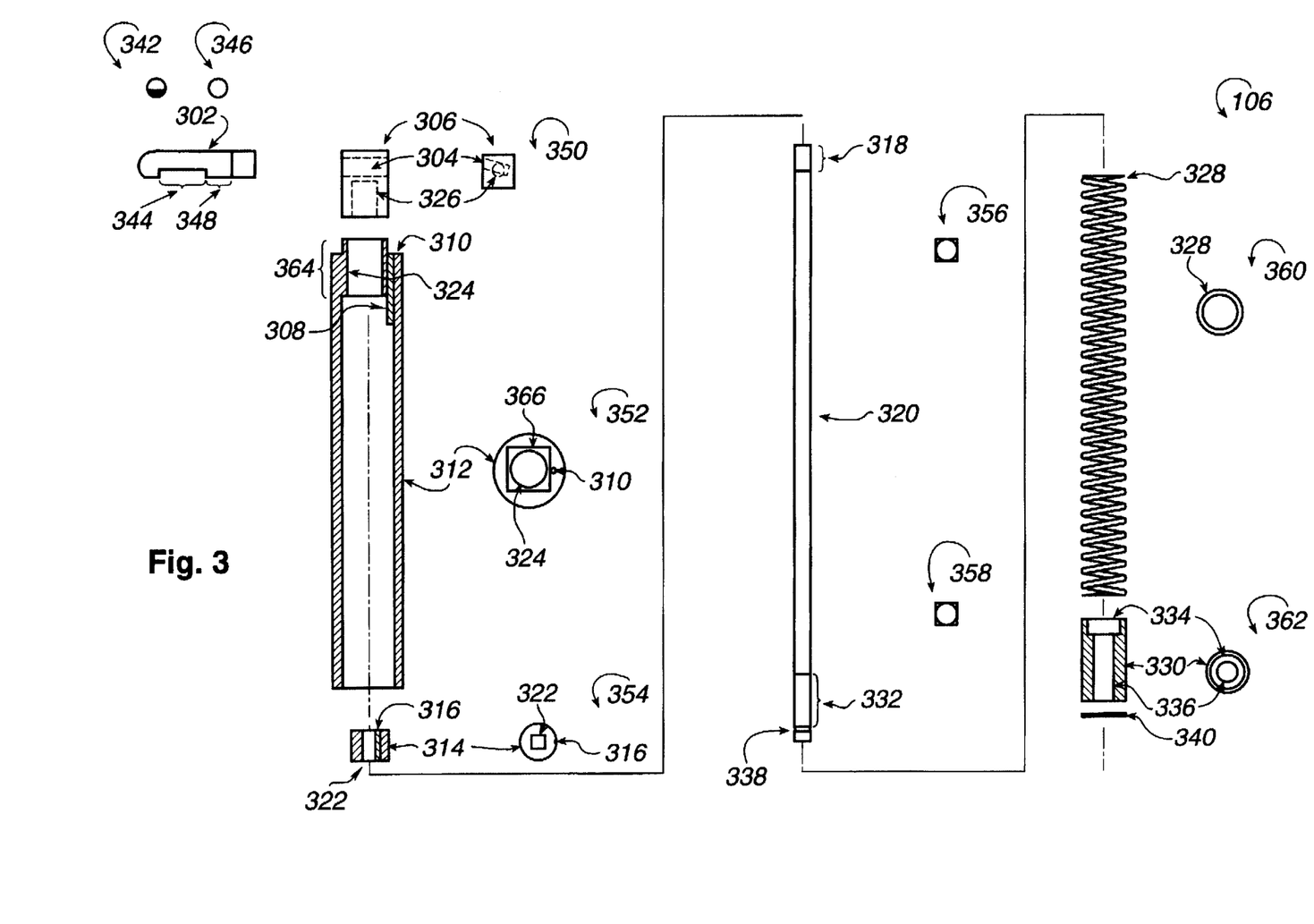
FIG. 3 is a parts diagram of a semiconductor wafer clamp apparatus.

FIGS. 2 and 3 depict various parts of semiconductor wafer clamp device 100. FIG. 2 shows a substrate holder 108, and FIG. 3 shows a semiconductor wafer clamp apparatus 106. In FIG. 3, a clamp finger 302 is pressed (i.e., permanently wedged) into an opening 304 in a connecting block 306. An alignment pin 308 is pressed (i.e., permanently wedged) into an opening 310 of a clamp conduit 312. A clamp shaft bushing 314 is mounted in clamp conduit 312 such that alignment pin 308 passes through a notch 316 in clamp shaft bushing 314. An upper end 318 of a clamp shaft 320 passes through clamp conduit 312, an opening 322 of clamp shaft bushing 314, and an opening 324 of clamp conduit 312. Upper end 318 of clamp shaft 320 is pressed (i.e., permanently wedged) into an opening 326 in connecting block 306. A spring 328 is mounted in clamp conduit 312 such that clamp shaft 320 passes through the center of spring 328, and an end of spring 328 contacts clamp shaft bushing 314 inside clamp conduit 312. A spring retainer 330 is mounted in clamp conduit 312 such that a bottom end 332 of clamp shaft 320 passes through a depression 334 and an opening 336 of spring retainer 330, an end of spring 328 contacts depression 334 in spring retainer 330, and a groove 338 in bottom end 332 of clamp shaft 320 is exposed. A "C" clip 340 is inserted into groove 338 in bottom end 332 of clamp shaft 320.

Cross-sectional views 342 and 346 are of clamp finger portions 344 and 348, respectively. Top views 350, 352, and 354, of connecting block 306, clamp conduit 312, and clamp shaft bushing 322, respectively, show associated details. Top view 356 shows clamp shaft 320 as viewed from top end 318. Top view 358 shows clamp shaft 320 as viewed from bottom end 332. Top views 360 and 362 of spring 328 and spring retainer 330, respectively, show associated details.

Clamp conduit 312 is mounted in substrate holder 108 (prior to assembly of semiconductor wafer clamp apparatus 106) by inserting upper end 364 through opening 204 in a bottom surface of substrate holder 108 until a top portion 366 of clamp conduit 312 passes through opening 206 of a top surface of substrate holder 108 and becomes flush with said top surface. Clamp conduit 312 is then caused to remain in place by deforming a portion 202 of substrate holder 108 surrounding the upper portion 366 of clamp conduit 312.

The above described semiconductor wafer clamp device requires a significant amount of time to perform routine maintenance and repair operations, reducing sputter operation throughput. The clamp fingers and connecting blocks of clamp apparatus tend to be subject to sputter deposition, and must be replaced frequently due to metal buildup. The clamp fingers and clamp shafts are pressed (i.e., permanently wedged) into the connecting blocks, and thus these parts are not individually replaceable. In addition, to gain access to clamp apparatus for maintenance or repair, the substrate holders must first be removed. As a result, not only is time spent removing and replacing the substrate holders, but the substrates, substrate holders, and their mounting screws become loose parts which may be inadvertently damaged or lost during the maintenance or repair activity.

In addition, spring 328 of semiconductor wafer clamp apparatus 106 tends to loose its resilience when subjected to repeated heating and cooling cycles during use. Further, semiconductor wafer clamp apparatus 106 employs a clamp shaft 320 with a square cross section in order to limit the rotational movement of clamp finger 302. Clamp shaft bushing 314 is also made of metal, and the square edges of clamp shaft 320 (i.e., the corners) tend to wear down rather rapidly due to metal-to-metal contact of moving parts. Excessive wear of the edges of the clamp shaft leads to excessive rotational movement of clamp finger 302, necessitating the replacement of the clamp finger 302 and connecting block 306 and clamp shaft 320. (Clamp finger 302 and connecting block 306 and clamp shaft 320 are pressed together to form a one-piece construction).

SUMMARY OF THE INVENTION

An improved semiconductor wafer clamp device of the present invention allows access to clamp apparatus from a top surface of a substrate holder, eliminating the need to remove the substrate holder in order to perform maintenance or repair operations on clamp apparatus. As a result, less time is required to perform routine maintenance and repair operations, and fewer parts are subject to inadvertent loss or damage. In addition, clamp finger and/or connecting block and/or clamp shaft members are replaced with separate components coupled together by adjustable connectors. The use of separate components coupled by adjustable connectors allows replacement of individual components. This feature is important in the case of clamp fingers and connecting blocks which tend to require frequent replacement due to rapid buildup of sputtered metal deposits.

Figure 7:
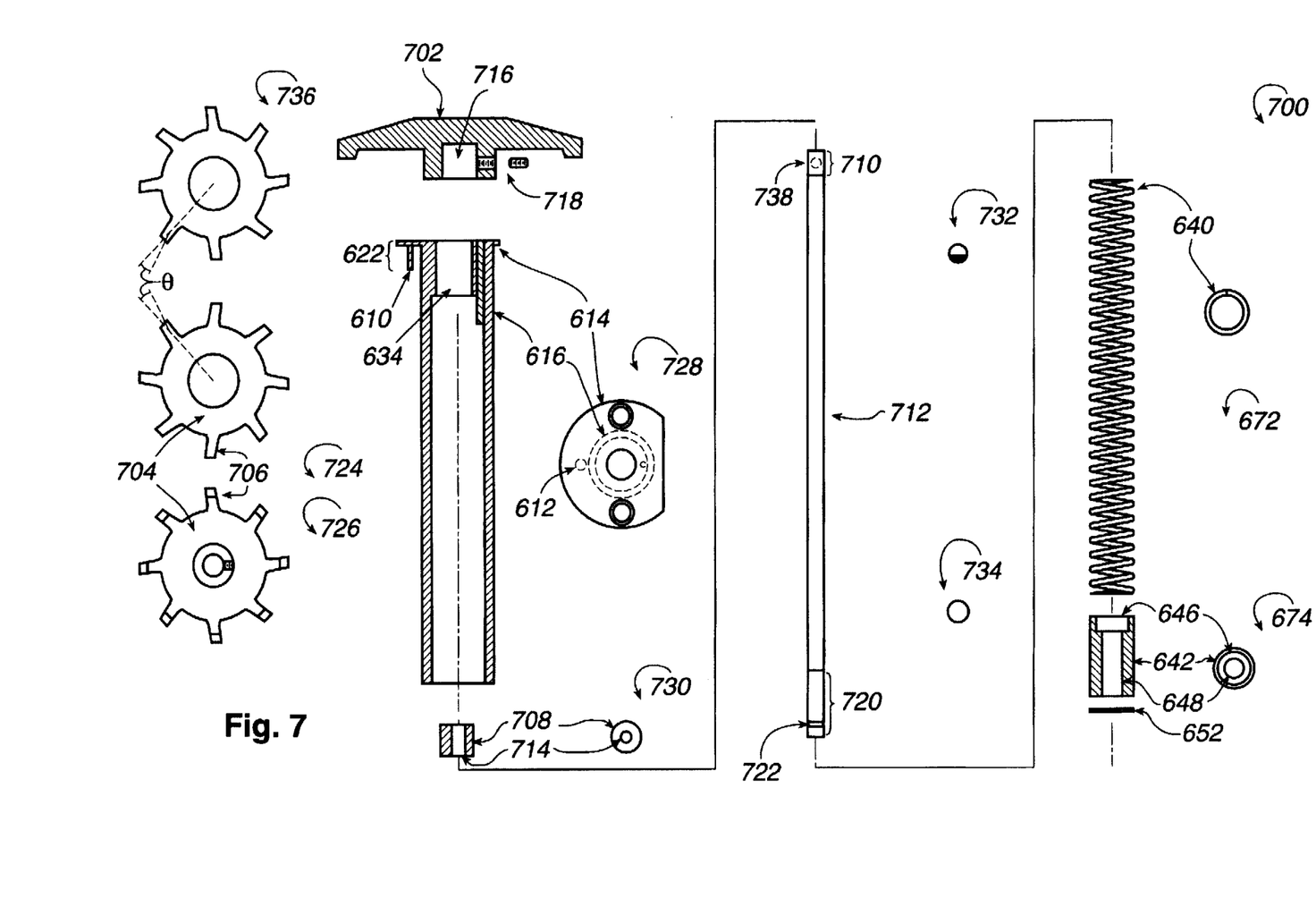
FIG. 7 depicts elements of an improved semiconductor wafer clamp apparatus employing a clamp member with projecting members extending outwardly from a body.

The use of a tempered spring in an improved semiconductor wafer clamp apparatus tends to reduce the loss of resilience experienced with non-tempered springs. The use of a heat-resistant hardened plastic material (e.g., Du Pont VESPEL polyimide) for clamp shaft bushings and spring retainers tends to extend the useful life of clamp apparatus components by eliminating wear caused by metal-to-metal contact of moving parts (while still permitting high temperature operation). A clamp apparatus employing a clamp member including a body and at least two projecting members extending outwardly from the body allows the use of a clamp shaft with a round cross section, eliminating many of the wear problems associated with a clamp apparatus employing a clamp shaft with a square cross section. In a preferred embodiment, the projecting members of the clamp member extend outwardly from the body at angles Θ of 0 to 22 degrees as shown in FIG. 7.

A method of the invention may relate to selectively depositing a metal film on a semiconductor wafer. This method may include (1) extending a clamp finger of an improved wafer claim device to a first position such that an opening exists between the first face of the substrate holder and the clamp finger, (2) inserting a semiconductor wafer between the clamp finger and a first face of the substrate holder, and (3) and depositing a metal film on at least a portion of the semiconductor wafer.

A second method of the invention may relate to changing a clamp finger of an improved semiconductor wafer clamp device. This method may include (1) decoupling the clamp finger from a connecting block, (2) removing the clamp finger, (3) installing a clamp finger in place of the removed clamp finger, and (4) coupling the installed clamp finger to the connecting block.

A third method of the invention may relate to changing a clamp finger and a connecting block of an improved semiconductor wafer clamp device. This method may include (1) decoupling the connecting block from the clamp shaft (the clamp finger to be changed being coupled to the connecting block), (2) removing the connecting block, (3) installing a connecting block in place of the removed connecting block (a second clamp finger being coupled to the second connecting block), and (4) coupling the installed connecting block to the clamp shaft.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
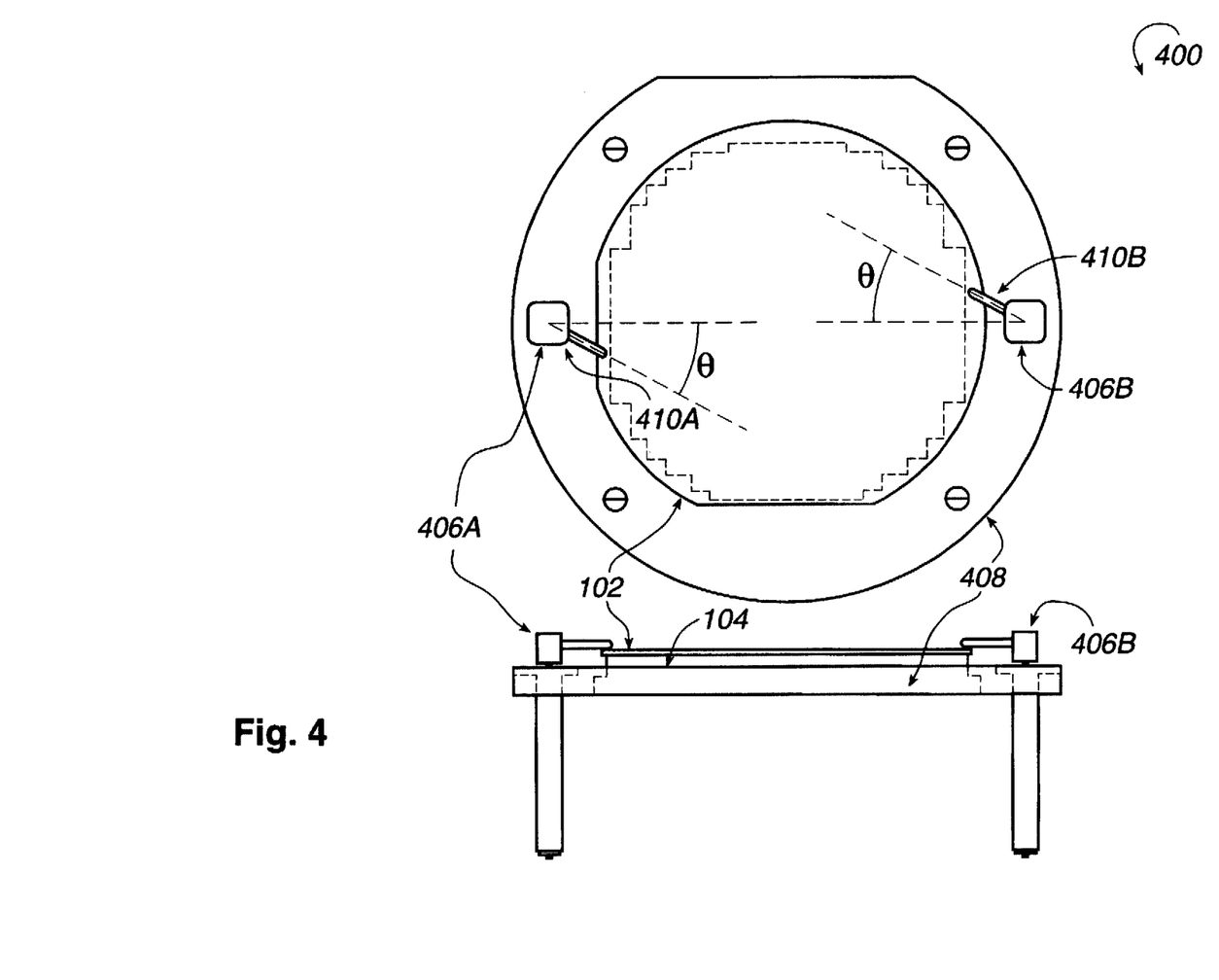
FIG. 4 is a diagram of an improved semiconductor wafer clamp device holding a semiconductor wafer against a substrate.

FIG. 4 shows an embodiment of an improved semiconductor wafer clamp device 400. In this embodiment, the wafer clamp device 400 is shown holding a semiconductor wafer 102 against a substrate 104. The semiconductor wafer may include, for instance, silicon, germanium, and gallium arsenide wafers.

As shown, semiconductor wafer clamp device 400 may include one or more semiconductor wafer clamp apparatus. FIG. 4 depicts two wafer claim apparatus 406A and 406B mounted in a substrate holder 408. Substrate 104 may be mounted in substrate holder 408.

Substrate holder 408 may be in a variety of shapes (e.g., annular, orthogonal, circular, oval, irregular, etc.). In FIG. 4, substrate holder 408 is shown to be roughly annular in shape. Substrate holder 408 may be made of, for instance, stainless steel.

During use, substrate holder 408 may be mounted to a surface (e.g., a substantially flat surface) in a sputter chamber. Semiconductor wafer 102 may then be subject to sputtered particles. Semiconductor wafer 102 may be mounted under clamp fingers 602 (see FIG. 6) of clamp apparatus 406A and 406B. Clamp fingers 602 may be directly or indirectly coupled to a resilient member 640 (e.g., a coil spring, a flat spring, etc.), thereby causing the semiconductor wafer 102 to be pressed against substrate 104. Substrate 104 and semiconductor wafer 102 may be heated by the emissions of a heat lamp mounted under substrate 104.

Projecting members 410A–B of clamp apparatus 406A–B may extend outwardly at angles Θ greater than 0 degrees as shown in FIG. 4. The use of projecting members 410A–B with different angles Θ during separate sputtering operations of a multi-layer metalization process may be employed to prevent shadowing of the areas of semiconductor wafer 102 directly under projecting members 410A–B, thus ensuring the entire surface of semiconductor wafer 102 receives sputtered particles.

Figure 5:
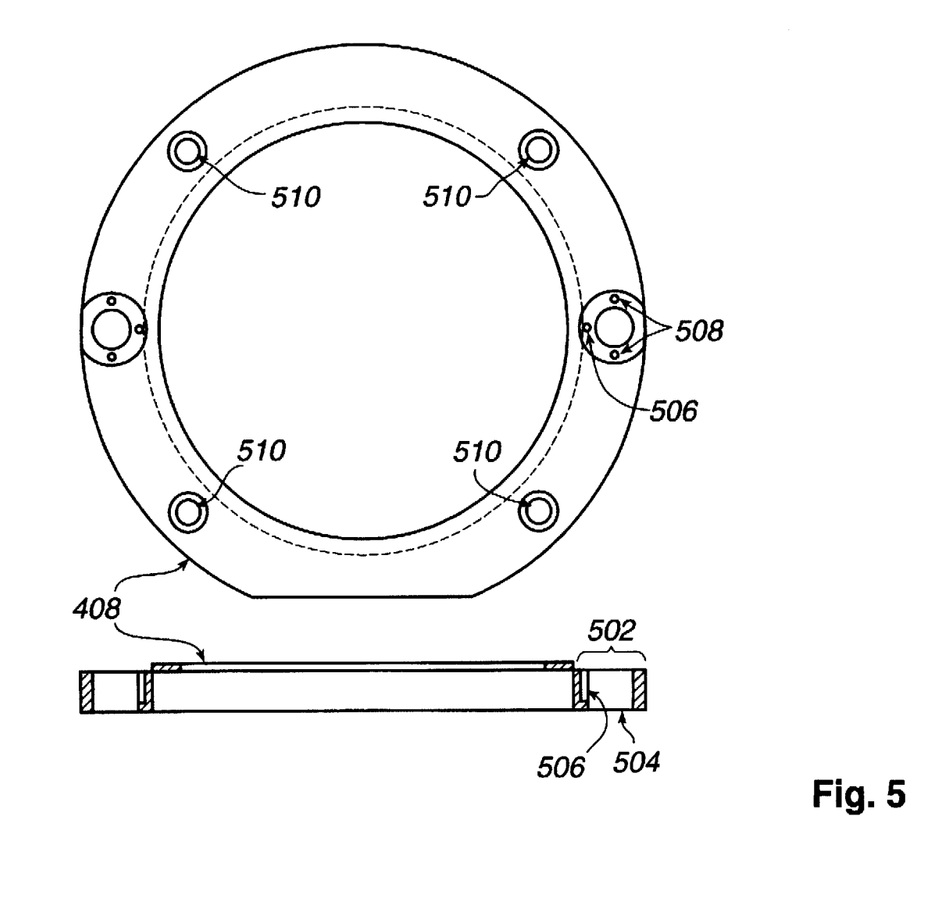
FIG. 5 is a diagram of an improved substrate holder.

FIG. 5 shows an improved substrate holder 408. Substrate holder 408 may include one or more openings 510 through which connectors (e.g. bolts or screws) may be inserted for the purpose of connecting the substrate holder 408 to a surface.

Figure 6:
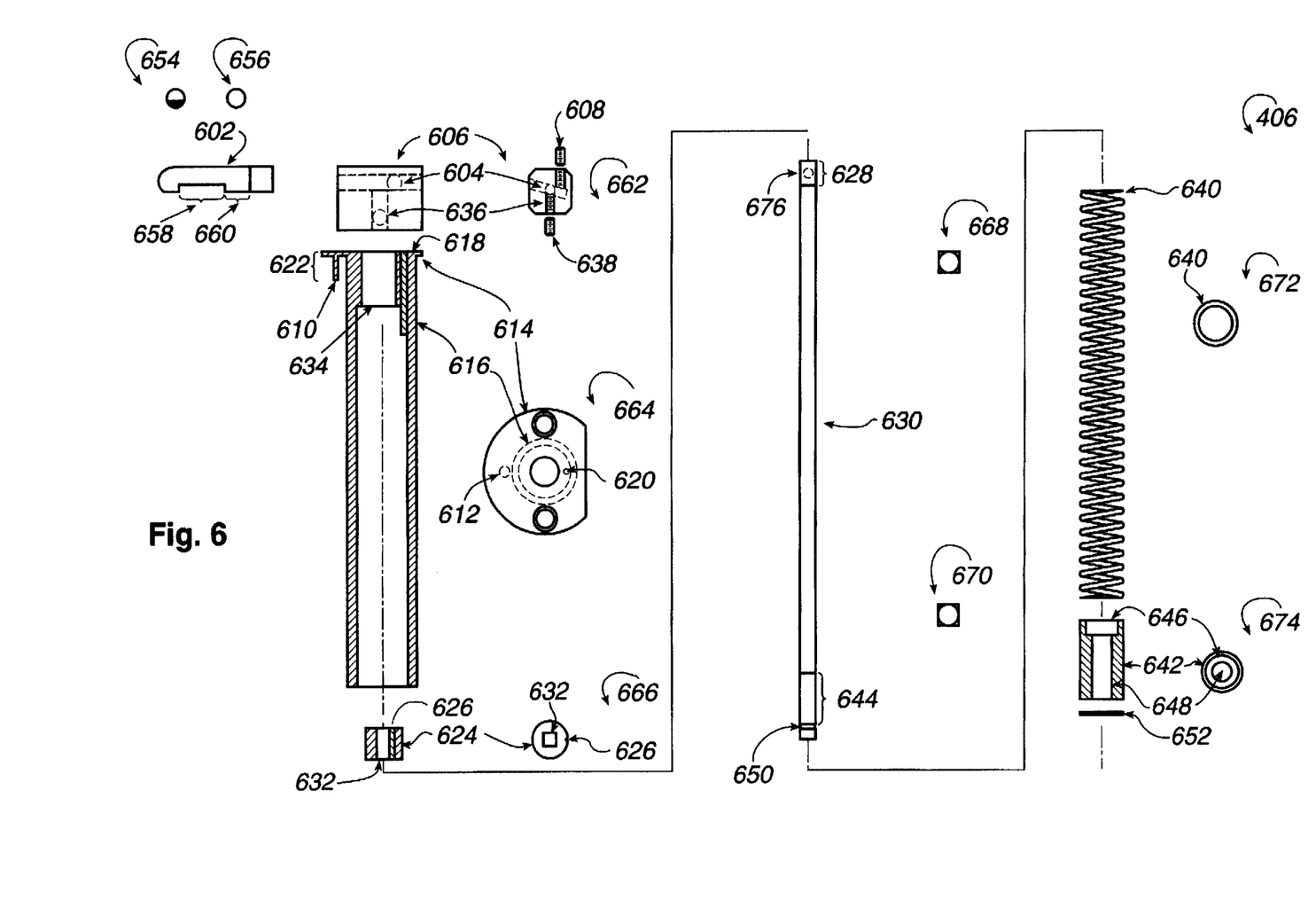
FIG. 6 depicts elements of an improved semiconductor wafer clamp apparatus employing a removable clamp finger and connecting block.

FIG. 6 shows various parts of an improved semiconductor wafer clamp apparatus 406. In FIG. 6, a removable clamp finger 602 may be inserted into an opening 604 in a connecting block 606 and held in place during use by an adjustable finger connector 608.

In the embodiment shown, removable clamp finger 602 is basically cylindrical with a substantially circular cross section. Alternative configurations may have cross sections including orthogonal, oval, irregular, etc. Removable clamp finger 602 may be made of aluminum.

The embodiment of connecting block 606 shown in FIG. 6 has substantially orthogonal cross sections. Alternative configurations may have circular, oval, or irregular cross sections. Connecting block 606 may be made of aluminum.

Adjustable finger connector 608 may be one of many types of adjustable connectors which will couple removable clamp finger 602 to connecting block 606 during use (e.g., a screw, a bolt, a wedge, etc.).

In one embodiment, a first alignment pin 610 may be wedged into an opening 612 in a flange 614, then welded in place. Flange 614 may be welded to clamp conduit 616. A second alignment pin 618 may be wedged into opening 620 in flange 614 and a top portion 622 of clamp conduit 616.

Clamp conduit 616 is tubular in the embodiment shown, thus having an annular cross section. Alternative configurations of clamp conduit 616 may have other cross sections including orthogonal, oval, irregular, etc. Clamp conduit 616 may be made of stainless steel.

In one embodiment, a clamp shaft bushing 624 is mounted in clamp conduit 616 such that alignment pin 618 passes through a notch 626 in clamp shaft bushing 624. Clamp shaft bushing 624 made be made of metal or hardened plastic. Types of heat-resistant hardened plastic which may be used include Du Pont VESPEL polyimide (resin designation SP-1, Du Pont Co., Wilmington, Del.), P-84 polyimide (HP Polymers, Louisville, Tex.), and Celazole U-60 (Hoechst Celanese, Houston, Tex.). An opening 632 of clamp shaft bushing 624 may be coated with a friction-reducing material such as Du Pont Teflon.

In one embodiment, an upper end 628 of a clamp shaft 630 passes through clamp conduit 616, opening 632 of clamp shaft bushing 624, and an opening 634 of clamp conduit 616. Upper end 628 of clamp shaft 630 is inserted into an opening 636 in connecting block 606 and held in place during use by an adjustable shaft connector 638. Adjustable shaft connector 638 may be one of many types of adjustable connectors which will couple connecting block 606 to clamp shaft 630 during use (e.g. a screw, a bolt, a wedge, etc.).

The embodiment of clamp shaft 630 shown has a substantially square cross section. Alternative configurations of clamp shaft 630 may have rectangular, triangular, or star-shaped cross sections. Clamp shaft 630 may be made of stainless steel.

The outer surface of clamp shaft 630 may be coated with a friction-reducing material such as Du Pont Teflon (Du Pont Co., Wilmington, Del.). Sharp edges of square clamp shaft 630 may be removed to reduce the tendency of clamp shaft 630 to cut into clamp shaft bushing 624 during use.

In a preferred embodiment, clamp shaft 630 has a depression 676 adapted to receive adjustable shaft connector 638 in order to overcome the lateral force exerted on the adjustable connector-shaft junction by a resilient member 640 described below.

Resilient member 640 is preferably mounted in clamp conduit 616 such that resilient member 640 exerts a force on clamp shaft 630 during use. Although a coil spring is shown, resilient member 640 may be one of many different types of resilient members (e.g., a flat spring, etc.).

The spring embodiment of resilient member 640 may be tempered by being heated in an oven at 400° C. for 8 hours, then removed and allowed to cool in the open air until it reaches room temperature (prior to assembly of semiconductor wafer clamp apparatus 406). This tempering helps resilient member 640 retain its shape despite repeated heating and cooling cycles experienced during use.

In the embodiment shown, an end of resilient member 640 contacts clamp shaft bushing 624 inside clamp conduit 616. A resilient member retainer 642 is mounted in clamp conduit 616 such that a bottom end 644 of clamp shaft 630 passes through a depression 646 and an opening 648 in resilient member retainer 642, an end of resilient member 640 contacts depression 646 in resilient member retainer 642, and a groove 650 in bottom end 644 of clamp shaft 630 is exposed.

As with clamp shaft bushing 624, resilient member retainer 642 may be made of metal or hardened plastic. Types of heat-resistant hardened plastic which may be used include Du Pont VESPEL polyimide (resin designation SP-1, Du Pont Co., Wilmington, Del.), P-84 polyimide (HP Polymers, Louisville, Tex.), and Celazole U-60 (Hoechst Celanese, Houston, Tex.). Opening 648 of resilient member retainer 642 may be coated with a friction-reducing material such as Du Pont Teflon.

Preferably, a removable coupling device 652 couples resilient member retainer 642 to clamp shaft 630 during use. Although a "C" clip is shown which fits into groove 650 in bottom end 644 of clamp shaft 630, removable coupling device 652 may be a nut (bottom end 644 of clamp shaft 630 being threaded to receive the nut), a cotter pin (bottom end 644 of clamp shaft 630 having an opening to receive the cotter pin), or other coupling devices known in the art.

Cross-sectional views 654 and 656 are of portions 658 and 660 of removable clamp finger 602, respectively. Top views 662, 664, and 666, of connecting block 606, clamp conduit 616, and clamp shaft bushing 624, respectively, show associated details. Top view 668 shows clamp shaft 630 as viewed from top end 628. Top view 670 shows clamp shaft 630 as viewed from bottom end 644. Top views 672 and 674 of resilient member 640 and resilient member retainer 642, respectively, show associated details.

In the embodiment shown in FIG. 5, a semiconductor wafer clamp apparatus 406 is mounted in substrate holder 408 by inserting the end of clamp conduit 640 opposite flange 614 through opening 504 in a top surface of substrate holder 408. Alignment pin 610 may be inserted into opening 506 of substrate holder 408, and flange 614 may fit into depression 502 of substrate holder 408. Semiconductor wafer clamp apparatus 406 may be held in place by two screws inserted through flange 614 of semiconductor wafer clamp apparatus 406 and into threaded openings 508 of substrate holder 408.

Turning now to FIG. 7, an embodiment of an improved semiconductor wafer clamp apparatus 700 is shown. A clamp member 702 includes a body 704 and projecting members 706. An alignment pin 610 is wedged into an opening 612 in a flange 614 and welded in place. Flange 614 is welded to clamp conduit 616.

Top view 724 and bottom view 726 show preferred embodiments of clamp member 702 in which the projecting members 706 extend outwardly from body 704 at an angle of less then 90 degrees. Top view 736 shows yet another embodiment in which the projecting members 706 extend outwardly from body 704 in the opposite direction (preferably at angles Θ of 0 to 22 degrees). Clamp member 702 may be made of metal or hardened plastic. Types of heat-resistant hardened plastic which may be used include Du Pont VESPEL polyimide (resin designation SP-1, Du Pont Co., Wilmington, Del.), P-84 polyimide (HP Polymers, Louisville, Tex.), and Celazole U-60 (Hoechst Celanese, Houston, Tex.).

Clamp conduit 616 is tubular in the embodiment shown, thus having an annular cross section. Alternative configurations of clamp conduit 616 may have other cross sections including orthogonal, oval, irregular, etc. Clamp conduit 616 may be made of stainless steel.

In one embodiment, a clamp shaft bushing 708 is mounted in clamp conduit 616 toward a top end 622 of clamp conduit 616. Clamp shaft bushing 708 may be made of metal or hardened plastic. Types of heat-resistant hardened plastic which may be used include Du Pont VESPEL polyimide (resin designation SP-1, Du Pont Co., Wilmington, Del.), P-84 polyimide (HP Polymers, Louisville, Tex.), and Celazole U-60 (Hoechst Celanese, Houston, Tex.). An opening 714 of clamp shaft bushing 708 may be coated with a friction-reducing material such as Du Pont Teflon.

In one embodiment, an upper end 710 of a clamp shaft 712 passes through clamp conduit 616, opening 714 of clamp shaft bushing 708, and an opening 634 of clamp conduit 616. Upper end 710 of clamp shaft 712 is inserted into an opening 716 in clamp member 702 and held in place during use by an adjustable clamp member connector 718. Adjustable clamp member connector 718 may be one of many types of adjustable connectors which will couple clamp member 702 to clamp shaft 712 during use (e.g. a screw, a bolt, a wedge, etc.).

Clamp shaft 712 may be made of stainless steel. The outer surface of clamp shaft 712 may be coated with a friction-reducing material such as Du Pont Teflon (Du Pont Co., Wilmington, Del.). In a preferred embodiment, clamp shaft 712 has a depression 738 adapted to receive adjustable shaft connector 718 in order to overcome the lateral force exerted on the adjustable connector-shaft junction by a resilient member 640 described below.

A resilient member 640 is preferably mounted in clamp conduit 616 such that resilient member 640 exerts a force on clamp shaft 712 during use. Although a coil spring is shown, resilient member 640 may be one of many different types of resilient members (e.g., a flat spring, etc.).

The spring embodiment of resilient member 640 may be tempered by being heated in an oven at 400° C. for 8 hours, then removed and allowed to cool in the open air until it reaches room temperature (prior to assembly of semiconductor wafer clamp apparatus 700). This tempering helps resilient member 640 retain its shape despite repeated heating and cooling cycles experienced during use.

In the embodiment shown, an end of resilient member 640 contacts clamp shaft bushing 708 inside clamp conduit 616. A resilient member retainer 642 is mounted in clamp conduit 616 such that a bottom end 720 of clamp shaft 712 passes through a depression 646 and an opening 648 in resilient member retainer 642, an end of resilient member 640 contacts depression 646 in resilient member retainer 642, and a groove 722 in bottom end 720 of clamp shaft 712 is exposed.

As with clamp shaft bushing 708, resilient member retainer 642 may be made of metal or hardened plastic. Types of heat-resistant hardened plastic which may be used include Du Pont VESPEL polyimide (resin designation SP-1, Du Pont Co., Wilmington, Del.), P-84 polyimide (HP Polymers, Louisville, Tex.), and Celazole U-60 (Hoechst Celanese, Houston, Tex.). Opening 648 of resilient member retainer 642 may be coated with a friction-reducing material such as Du Pont Teflon.

Preferably a removable coupling device 652 couples resilient member retainer 642 to clamp shaft 712 during use. Although a "C" clip is shown which fits into groove 722 in bottom end 720 of clamp shaft 712, removable coupling device 652 may be a nut (bottom end 720 of clamp shaft 712 being threaded to receive the nut), a cotter pin (bottom end 720 of clamp shaft 712 having an opening to receive the cotter pin), or other coupling devices known in the art.

Top view 724 and bottom view 726 are of clamp member 702. Top views 728 and 730 are of flange 614 and clamp shaft bushing 708, respectively. Top view 732 shows clamp shaft 712 as viewed from top end 710. Top view 734 shows clamp shaft 712 as viewed from bottom end 720. Top views 672 and 674 of resilient member 640 and resilient member retainer 642, respectively, show associated details.

The improved semiconductor wafer clamp device allows the removable clamp finger and/or connecting block and/or clamp shaft members to be replaced separately. This feature is important in the case of clamp fingers and connecting blocks which tend to require frequent replacement due to rapid buildup of sputtered metal deposits. Experimental results are shown in Table 1 below.

TABLE 1

Experimental Results.

| Item | Required Replacement Frequency | |
| --- | --- | --- |
| | Unmodified | Improved |
| Clamp Finger | Every 6 Days | Every 6 Days |
| Connecting Block | Every 6 Days | Every 14 Days |
| Clamp Shaft | Every 6 Days | Every 30 Days |
| Clamp Spring | Every 6 Days | Every 30 Days |
| Clamp Tube | Every 6 Days | Every 30 Days |

The improved wafer clamp device of the present invention also allows access to clamp apparatus from a top surface of a substrate holder, eliminating the need to remove the substrate holder from a mounting surface in order to perform maintenance or repair operations on clamp apparatus. As a result, less time is required to perform routine maintenance and repair operations, and fewer parts are subject to inadvertent loss or damage.

As mentioned above, the use of a tempered spring in an improved semiconductor wafer clamp apparatus tends to reduce the loss of resilience experienced with non-tempered springs.

The use of a heat-resistant hardened plastic material (e.g., Du Pont VESPEL polyimide) for clamp shaft bushings and spring retainers tends to extend the useful life of clamp apparatus components by eliminating wear caused by metal-to-metal contact of moving parts (while still permitting high temperature operation).

A clamp apparatus employing a clamp member including a body and at least two projecting members extending outwardly from the body allows the use of a clamp shaft with a round cross section, eliminating many of the wear problems associated with a clamp apparatus employing a clamp shaft with a square cross section. In a preferred embodiment, the projecting members of the clamp member extend outwardly from the body at angles $\Theta$ of 0 to 22 degrees as shown in FIG. 7.

The improved semiconductor wafer clamp device may be used to selectively deposit a metal film on a semiconductor wafer. When mounted on a substantially flat surface in a sputter deposition chamber, the clamp finger(s) of clamp apparatus may be extended to a first position such that an opening exists between the first face of the substrate holder and the clamp finger. A semiconductor wafer may then be inserted in the opening between the clamp finger and a first face of the substrate holder. A metal film may then be deposited on at least a portion of the semiconductor wafer.

One advantage of the improved semiconductor wafer clamp apparatus is the ease with which a clamp finger may be changed. First, the clamp finger to be removed may be decoupled from a connecting block by loosening or removing an adjustable finger connector. The clamp finger to be replaced may then be removed, and a second clamp finger installed in the connecting block in place of the removed clamp finger. The second clamp finger may then be coupled to the connecting block by tightening or installing the adjustable finger connector.

A clamp finger and a connecting block of a semiconductor wafer clamp apparatus may even be replaced simultaneously. First, the connecting block may be decoupled from the clamp shaft by loosening or removing an adjustable clamp shaft connector (the clamp finger to be changed may be coupled to the connecting block). The connecting block to be replaced may then be removed, and a second connecting block installed in place of the removed connecting block (a second clamp finger may be coupled to the second connecting block). The second connecting block may then be coupled to the clamp shaft by tightening or installing the adjustable clamp shaft connector.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements and compositions described herein or in the features or in the sequence of features of the methods described herein without departing from the spirit and scope of the invention as described in the following claims.

What is claimed is:

1. A semiconductor wafer clamp apparatus, comprising:

a removable clamp finger adapted to clamp a semiconductor wafer during use; a connecting block comprising a clamp finger opening, a clamp shaft opening, a finger connector opening, and a shaft connector opening, the clamp finger opening being sized to receive a portion of the removable clamp finger;

an adjustable finger connector sized to fit within the connector opening and adapted to couple the removable clamp finger to the connecting block during use;

a clamp conduit comprising a top end having a flange disposed thereon to attach the clamp conduit to the connecting block, thereby forming a removable engagement between the clamp conduit and the connecting block to allow the clamp conduit to be accessed through the top end during use;

a clamp shaft adapted to move longitudinally within the clamp conduit during use; and an adjustable shaft connector adapted to couple the clamp shaft to the connecting block during use, the adjustable shaft connector being sized to fit within the shaft connector opening.

2. A semiconductor wafer clamp apparatus, comprising: a removable clamp finger adapted to clamp a semiconductor wafer during use;

a connecting block comprising a clamp finger opening, a clamp shaft opening, a finger connector opening, and a shaft connector opening, the clamp finger opening being sized to receive a portion of the removable clamp finger;

an adjustable finger connector adapted to couple the removable clamp finger to the connecting block during use, the adjustable finger connector being sized to fit within the finger connector opening;

a clamp conduit having a connecting member at one end, the connecting member being adapted to be attached to the connecting block;

a clamp shaft adapted to move longitudinally within the clamp conduit during use; and an adjustable shaft connector adapted to couple the clamp shaft to the connecting block during use, the adjustable shaft connector being sized to fit within the shaft connector opening.

3. The semiconductor wafer clamp apparatus of claim 2, further comprising a resilient member adapted to be coupled to the clamp conduit, and adapted to apply force to the clamp shaft during use.

4. The semiconductor wafer clamp apparatus of claim 3 wherein the resilient member comprises a tempered spring.

5. The semiconductor wafer clamp apparatus of claim 2, further comprising a clamp shaft bushing comprising plastic, the clamp shaft bushing adapted to fit within the clamp conduit such that the clamp shaft moves within an inner opening of the clamp shaft bushing during use.

6. The semiconductor wafer clamp apparatus of claim 3, further comprising a resilient member retainer comprising plastic, the resilient member retainer being coupled to the clamp shaft and adapted to retain the resilient member within the clamp conduit during use.

7. A semiconductor wafer clamp device, comprising:
a substrate holder with a first face opposite a second face; and
a semiconductor wafer clamp apparatus, comprising:
a removable clamp finger adapted to clamp a semiconductor wafer during use;
a connecting block comprising a clamp finger opening, a clamp shaft opening, a finger connector opening, and a shaft connector opening, the clamp finger opening being sized to receive a portion of the removable clamp finger;
an adjustable finger connector adapted to couple the removable clamp finger to the connecting block during use, the adjustable finger connector being sized to fit within the finger connector opening;
a clamp conduit having a connecting member at one end adapted to be attached to the connecting block;
a clamp shaft adapted to move longitudinally within the clamp conduit during use;
an adjustable shaft connector adapted to couple the clamp shaft to the connecting block during use, the adjustable shaft connector being sized to fit within the shaft connector opening; and
a clamp shaft bushing comprising an inner opening, the clamp shaft bushing being positionable within the clamp conduit such that the clamp shaft moves within an inner opening of the clamp shaft bushing during use;
and wherein the first face of the substrate holder is adapted to receive a substrate, and wherein the second face of the substrate holder is adapted to receive the semiconductor wafer clamp apparatus.

8. The semiconductor wafer clamp device of claim 7, wherein the semiconductor wafer clamp apparatus further comprises a resilient member adapted to be coupled to the clamp conduit and adapted to apply force to the clamp shaft during use.

9. The semiconductor wafer clamp device of claim 8, wherein the semiconductor wafer clamp apparatus further comprises
a resilient member retainer comprising plastic, the resilient member retainer being coupled to the clamp shaft and adapted to retain the resilient member within the clamp conduit during use.

10. A semiconductor wafer clamp apparatus, comprising:
a clamp member, comprising:
a body; and
at least two projecting members extending outwardly from the body, wherein each of the projecting members is adapted to clamp a semiconductor wafer during use;
a clamp conduit having a connecting member at one end adapted to engage the body of the clamp member;
a clamp shaft adapted to move longitudinally within the clamp conduit during use; and
an adjustable clamp member connector adapted to couple the clamp member to the clamp shaft during use.

11. The semiconductor wafer clamp apparatus of claim 10, wherein at least one of the projecting members extend outwardly from the body at an angle of greater than 0 degrees and less than about 22 degrees.

12. The semiconductor wafer clamp apparatus of claim 10, further comprising:
a clamp shaft bushing adapted to fit within the clamp conduit such that the clamp shaft moves within an inner opening of the clamp shaft bushing during use.

13. The semiconductor wafer clamp apparatus of claim 10, further comprising a resilient member coupled to the clamp conduit and adapted to apply force to the clamp shaft during use.

14. The semiconductor wafer clamp apparatus of claim 13, wherein the resilient member comprises a tempered spring.

15. The semiconductor wafer clamp apparatus of claim 10, further comprising a clamp shaft bushing comprising plastic, the clamp shaft bushing adapted to fit within the clamp conduit such that the clamp shaft moves within an inner opening of the clamp shaft bushing during use.

16. The semiconductor wafer clamp apparatus of claim 13, further comprising a resilient member retainer comprising plastic, the resilient member retainer being coupled to the clamp shaft and adapted to retain the resilient member within the clamp conduit during use.

17. The semiconductor wafer clamp apparatus of claim 12 wherein the clamp shaft bushing comprises plastic, and further comprising:
a resilient member coupled to the clamp conduit and adapted to apply force to the clamp shaft during use; and
a resilient member retainer comprising plastic, the resilient member retainer being coupled to the clamp shaft and adapted to retain the resilient member within the clamp conduit during use.

18. A semiconductor wafer clamp device, comprising:
a substrate holder with a first face opposite a second face; and
a semiconductor wafer clamp apparatus, comprising:
a clamp member, comprising:
a body; and
at least two projecting members extending outwardly from the body, wherein each of the projecting members is adapted to clamp a semiconductor wafer during use;
a clamp conduit having a connecting member at one end;
a clamp shaft adapted to move longitudinally within the clamp conduit during use;
an adjustable clamp member connector adapted to couple the clamp member to the clamp shaft during use; and
a clamp shaft bushing comprising plastic, the clamp shaft bushing adapted to fit within the clamp conduit such that the clamp shaft moves within an inner opening of the clamp shaft bushing during use;

wherein the first face of the substrate holder is adapted to receive a substrate, and wherein the second face of the substrate holder is adapted to receive the semiconductor wafer clamp apparatus.

19. The semiconductor wafer clamp device of claim 8, wherein the resilient member comprises a tempered spring.

20. The semiconductor wafer clamp device of claim 18, wherein the semiconductor wafer clamp apparatus further comprises a resilient member coupled to the clamp conduit and adapted to apply force to the clamp shaft during use.

21. The semiconductor wafer clamp device of claim 20, wherein the resilient member comprises a tempered spring.

22. The semiconductor wafer clamp device of claim 20, wherein the semiconductor wafer clamp apparatus further comprises a resilient member retainer comprising plastic, the resilient member retainer being coupled to the clamp shaft and adapted to retain the resilient member within the clamp conduit during use.

\* \* \* \* \*